United States Patent
Liu et al.

(10) Patent No.: US 8,191,248 B2
(45) Date of Patent: Jun. 5, 2012

(54) METHOD FOR MAKING AN EMBEDDED STRUCTURE

(75) Inventors: Yi-Chun Liu, Taipei County (TW); Wei-Ming Cheng, Kaohsiung (TW); Tsung-Yuan Chen, Taoyuan County (TW); Shu-Sheng Chiang, Taipei (TW)

(73) Assignee: Unimicron Technology Corp., Kwei-San Industrial Zone, Taoyuan (TW)

( * ) Notice: Subject to any disclaimer, the term of this patent is extended or adjusted under 35 U.S.C. 154(b) by 838 days.

(21) Appl. No.: 12/211,816

(22) Filed: Sep. 17, 2008

(65) Prior Publication Data
US 2010/0065324 A1    Mar. 18, 2010

(51) Int. Cl.
*H01K 3/10*    (2006.01)
(52) U.S. Cl. ............. 29/852; 29/825; 29/840; 29/846
(58) Field of Classification Search ............ 29/825, 29/832, 840, 846, 852
See application file for complete search history.

(56) References Cited

U.S. PATENT DOCUMENTS

| | | |
|---|---|---|
| 6,930,256 B1 | 8/2005 | Huemoeller et al. |
| 6,930,257 B1 | 8/2005 | Hiner et al. |
| 6,967,124 B1 | 11/2005 | Huemoeller et al. |
| 6,987,661 B1 | 1/2006 | Huemoeller et al. |
| 7,028,400 B1 | 4/2006 | Hiner et al. |
| 7,297,562 B1 | 11/2007 | Huemoeller et al. |
| 7,312,103 B1 | 12/2007 | Huemoeller et al. |
| 7,334,326 B1 | 2/2008 | Huemoeller et al. |
| 2005/0041398 A1 | 2/2005 | Huemoeller et al. |
| 2008/0020132 A1 | 1/2008 | Huemoeller et al. |
| 2008/0043447 A1 | 2/2008 | Huemoeller et al. |
| 2008/0149369 A1* | 6/2008 | Kawamura et al. ........... 174/251 |

FOREIGN PATENT DOCUMENTS

| | | |
|---|---|---|
| TW | 200805611 | 1/2008 |
| WO | 2006126621 | * 11/2006 |

* cited by examiner

*Primary Examiner* — Carl Arbes
(74) *Attorney, Agent, or Firm* — Winston Hsu; Scott Margo

(57) ABSTRACT

An embedded structure of circuit board is provided. The embedded structure of the present invention includes a dielectric layer, a pad opening disposed in the dielectric layer, and a via disposed in the pad opening and in the dielectric layer, wherein the outer surface of the dielectric layer has a substantially even surface.

18 Claims, 7 Drawing Sheets

METHOD FOR MAKING AN EMBEDDED STRUCTURE

BACKGROUND OF THE INVENTION

1. Field of the Invention

The present invention relates to an embedded structure and the fabrication method thereof. In particular, the present invention relates to an embedded structure of the circuit board with a smoother surface on the inner wall.

2. Description of the Prior Art

Circuit boards are essential elements in electronic devices. The function of the circuit boards is to define the pre-determined circuit patterns on a solid surface. For the trend of miniaturization of the electronic devices, the line width and the line space of the conductive wires on the circuit boards are narrower and narrower.

Currently, there are two methods available to form the circuit boards to meet the demand. The first one is to transfer-print patterned wires into a dielectric layer. The other one is to pattern a substrate by laser to define a damascene structure, then use a conductive material to fill the recesses on the substrate to complete an embedded structure. Generally speaking, the surface of the substrate is required to be activated in advance to allow the conductive material to successfully fill the recesses on the substrate, frequently by electroless plating methods. Even more, a material is proposed to allow the conductive material to be disposed on the recesses on the substrate without a prior activation procedure for the electroless plating.

FIGS. 1-4 illustrate a conventional method to form an embedded structure. As shown in FIG. 1, first, a substrate 101 is provided. A first patterned copper layer 110 is disposed on the substrate 101 and partially exposes the substrate 101. A first dielectric layer 120 covers the first patterned copper layer 110 and the substrate 101.

As shown in FIG. 2, the first dielectric layer 120 is patterned to form a pad opening 122, a via 121 integrally formed with the pad opening 122, and a trench 123 adjacent to the pad opening 122. The via 121 exposes a portion of the first patterned copper layer 110. Because residues may remain on the exposed surface of the first patterned copper layer 110 and would hinder the following electric connection, a desmearing procedure is carried out, as shown in FIG. 3 to remove the residues on the exposed surface of the first patterned copper layer 110 and to facilitate the following electric connection. The desmearing procedure may be carried out by employing plasma or an oxidizing agent, such as permanganate. In addition to removing all the residues on the exposed surface of the first patterned copper layer 110, the desmearing procedure also etches the surface of the first dielectric layer 120, including sidewalls of the pad opening 122, the via 122 as well as the trench 123, thereby forming a rugged surface on the first dielectric layer 120. If such rugged surface further undergoes a copper deposition, as shown in FIG. 4, undesirable lumps 131 occur everywhere in the copper layer 130 and deteriorate the quality of the copper layer 130, or the rugged surface limits the design of circuit of high density. Even more, the rugged surface of the trench 123 results in rugged circuits and causes signal loss. The copper layer 130 of bad quality jeopardizes the reliability of the embedded structure 100, of the circuit board and of the electric device made thereof. It is a disadvantage to be overcome.

Therefore, an embedded structure of better surface evenness as well as a novel manufacturing process are needed to provide a circuit board with good reliability.

SUMMARY OF THE INVENTION

The present invention therefore proposes a novel embedded structure with a smoother surface on the inner wall as well as a method for making such embedded structure to overcome the aforesaid problems. Because the inner wall of the embedded structure of the present invention has a much smoother surface, the number of copper lumps is minimized and a conductive layer of better quality can be obtained when a layer of copper is deposited on the inner wall of the embedded structure of the present invention, which enhances the reliability of the embedded circuit structure of the present invention. In addition, in one embodiment of the present invention, the embedded structure of the present invention may further have a substantially even outer surface.

The present invention first provides an embedded structure. The embedded structure of the present invention includes a dielectric layer, a pad opening disposed in the dielectric layer, and a via disposed in the dielectric layer and in the pad opening, wherein the via and the pad opening together define the embedded structure, and further the inner wall of the via has a roughness C, the inner wall of the pad opening has a roughness B, and the outer surface of the dielectric layer has a substantially even surface with a roughness A. A, B, C are mutually different.

The present invention still provides a method for defining an embedded structure. In the method for defining an embedded structure of the present invention, first a dielectric layer is provided. Second, an organic film layer is formed to cover the dielectric layer. Then, a via is formed in the dielectric layer and in the organic film layer. Afterwards, a cleaning step is performed to roughen the inner wall of the via. Later, the dielectric layer and the organic film layer are patterned to form a pad opening overlapping with the via in the dielectric layer. The via and the pad opening together define the embedded structure. The outer surface of the dielectric layer has a roughness A, the inner wall of the pad opening has a roughness B, and the inner wall of the via has a roughness C. A, B, C are mutually different.

Because the novel embedded structure of the present invention goes through a patterning step to define the pad opening, or the optional trench after the cleaning step, the inner wall of the embedded structure of the present invention may have a smoother surface and avoid the attack of the cleaning step. The cleaning step on one hand lets the interconnection, i.e. the internal electrical connection, in the via have better affinity to the inner wall of the via.

Moreover, less copper lumps will be formed and a conductive layer of better quality can be obtained when a layer of copper is later deposited on the inner wall of the embedded structure of the present invention, which raises the reliability of the embedded circuit structure of the present invention. In addition, the embedded structure of the present invention may further have a substantially even outer surface due to the protection of the organic film layer.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a novel embedded structure as well as a method for making an embedded structure. Because the embedded structure of the present invention has gone through a patterning step after the cleaning step, the inner wall of the embedded structure of the present invention has a smoother surface. Moreover, less copper lumps will be formed and a conductive layer of better quality can be obtained when a layer of copper is later deposited on the inner wall of the embedded structure of the present invention due to the smoother surface, which enhances the reliability of the embedded circuit structure of the present invention. Moreover, the embedded structure of the present invention may further have a substantially even outer surface because of the protection of the organic film layer during the manufacturing process.

Figure 1:
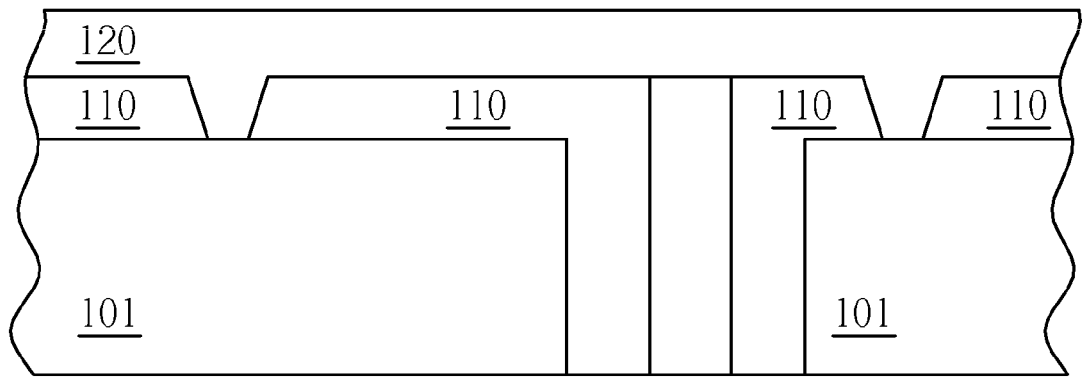
FIGS. 1-4 illustrate a conventional method to form an embedded structure in the prior art.
Figure 2:
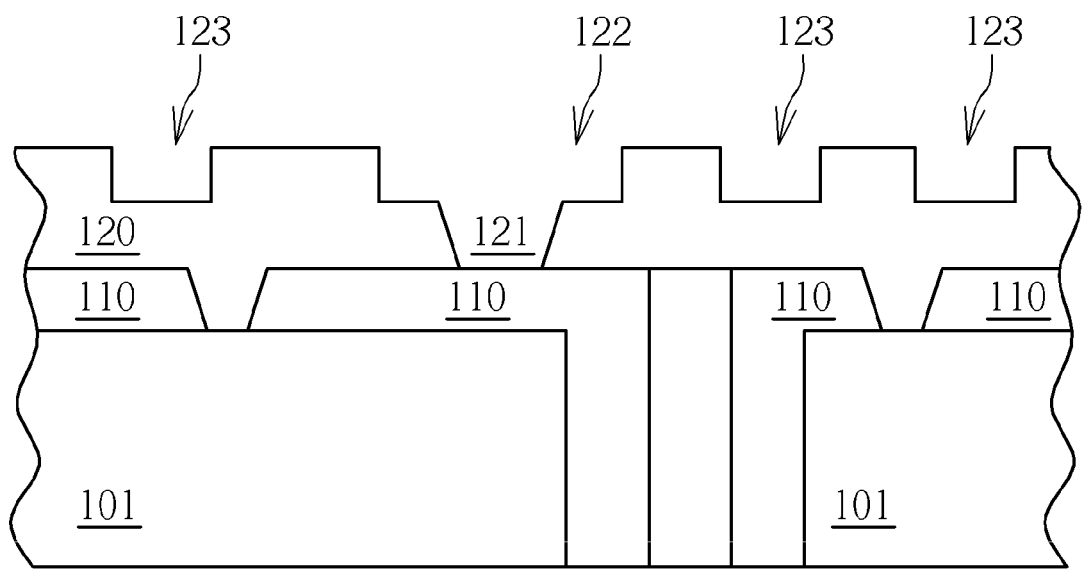
Figure 3:
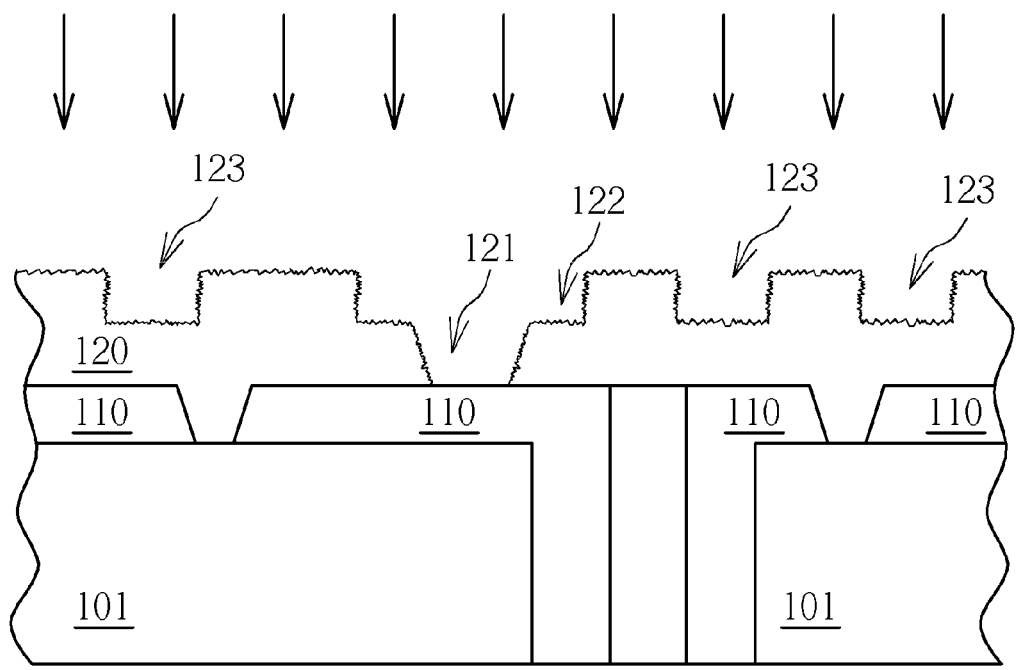
Figure 4:
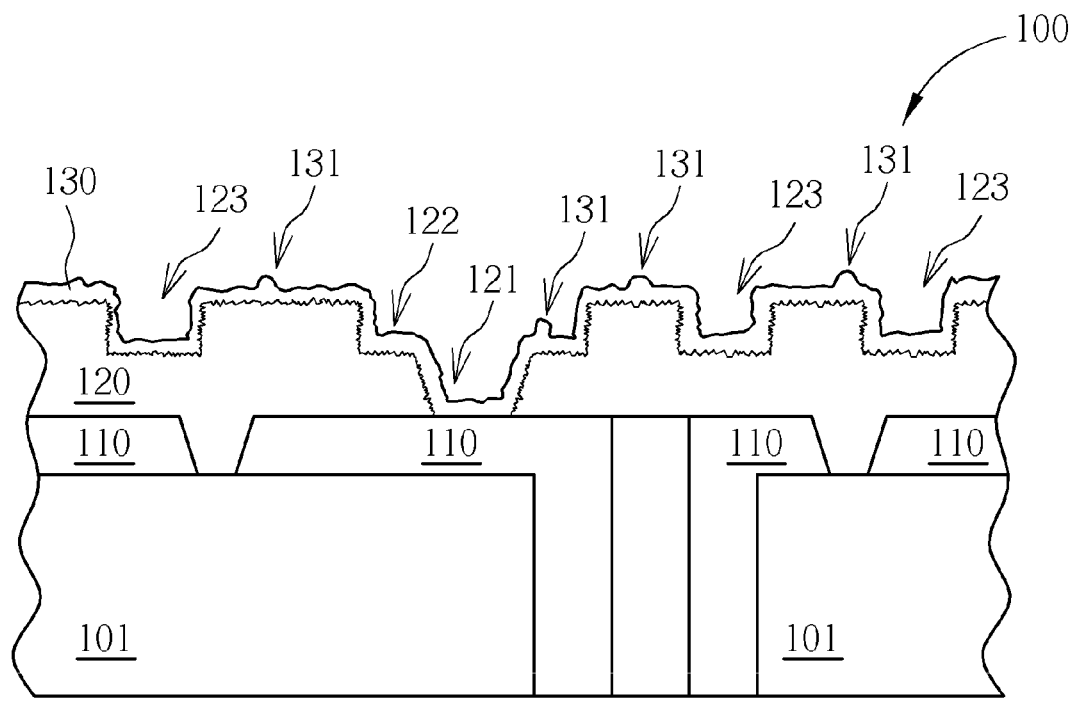
Figure 5:
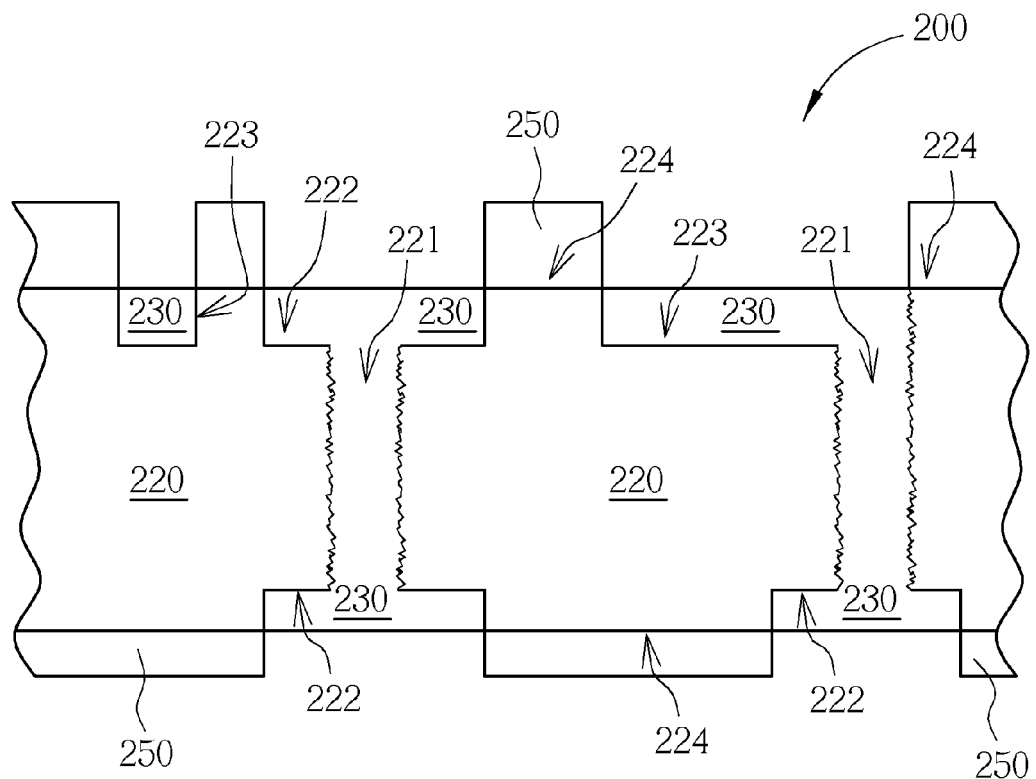
FIG. 5 illustrates an embodiment of the embedded structure of the present invention.

The present invention first provides an embedded structure. FIG. 5 illustrates an embodiment of the embedded structure of the present invention. As shown in FIG. 5, the embedded structure 200 of the present invention includes a dielectric layer 220, a via 221, and a pad opening 222.

The outer surface 224 of the dielectric layer 220 is supposed to have a substantially even surface. For example, the outer surface 224 of the dielectric layer 220 has a roughness A. The roughness A may be expressed by the parameters Ra. Please refer to JIS B 0601-1982 for the details of the parameters Ra. If expressed by Ra, the roughness A is <0.5 μm.

In one embodiment of the present invention, the dielectric layer 220 may further include a metallic complex, such as Mn, Cr, Pd or Pt. Once activated, such as by laser, the dielectric layer 220 helps another conductive layer to deposit with the help of the metallic complex.

The pad opening 222 is formed in the dielectric layer 220. Besides, the via 221 is formed inside the pad opening 222 and in the dielectric layer 220 as well so that the pad opening 222 encircles the via 221 from a top view (not shown). The via 221 and the pad opening 222 together define the circuit of the embedded structure of the present invention. Each via 221 may have at least one pad opening 222. In other words, a via 221 may optionally have one pad opening 222 or two pad openings 222, as shown in FIG. 5.

Figure 13:
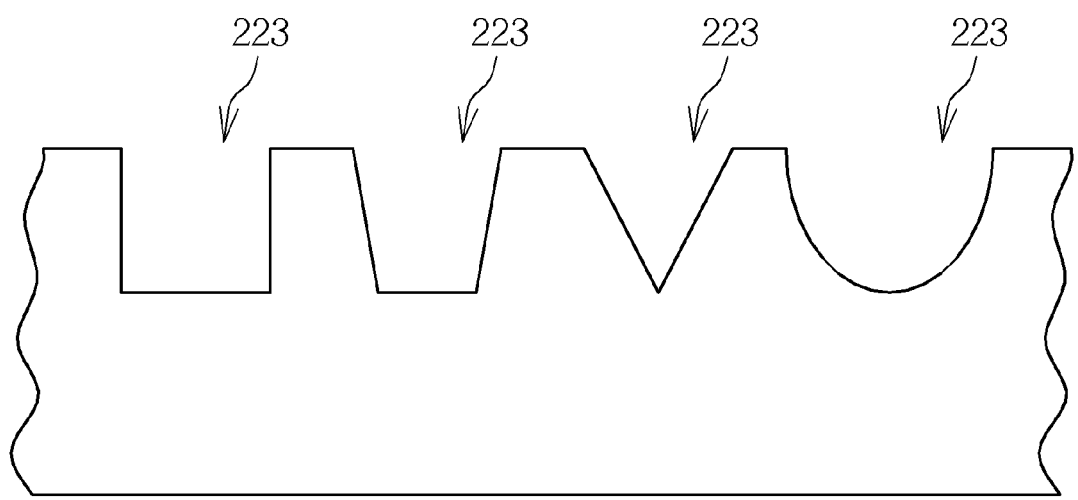
FIG. 13 illustrates various embodiments of the trench of the present invention.

Additionally, the dielectric layer 220 may include a trench 223 which does not encircle the via 221 but may be connected to the via 221, as shown in FIG. 5. The trench 223 may have various shapes, as illustrated in FIG. 13.

Similarly, the inner wall of the trench has a roughness B, the inner wall of the pad opening has a roughness B and the inner wall of the via has a roughness C. If expressed by Ra, the roughness B is between 0.2 μm and 1.5 μm. Again, if expressed by Ra, the roughness C is between 0.5 μm and 5.0 μm. A, B and C are mutually different. For example, the roughness A, B and C have relative relations, C>B>A.

In one embodiment of the present invention, a conductive layer 230 may fill the via 221, the pad opening 222 and the optional trench 223 to form the embedded circuit structure of the present invention. The conductive layer 230 usually includes a metal, such as Cu or Al, which may be formed by an electroless plating procedure. If the dielectric layer 220 includes the metallic complex, the dielectric layer acts as a seed layer for the conductive layer 230.

In order to achieve a substantially even surface for the outer surface 224 of the dielectric layer 220, in another embodiment of the present invention, the embedded structure of the present invention may include an organic film layer 250 covering the dielectric layer 220 and selectively exposing the via 221, the pad opening 222 and the optional trench 223 to protect the outer surface 224 of the dielectric layer 220. The organic film layer 250 may optionally cover one outer surface 224 of the dielectric layer 220 or both sides of the outer surface 224 of the dielectric layer 220.

The organic film layer 250 may include a hydrophilic polymer to be optionally removed by water. For instance, the hydrophilic polymer may include functional groups such as hydroxyl group (—OH), amide group (—CONH2), sulfonic group (—SO3H) and/or carboxylic group (—COOH).

Alternatively, the organic film layer 250 may include a hydrophobic polymer. For instance, the hydrophobic polymer may be methacrylate resin, vinyl phenyl resin, allyl resin, polyacrylate resin, polyether resin, polyolefin resin, polyamide resin, or polysiloxane resin.

Figure 6:
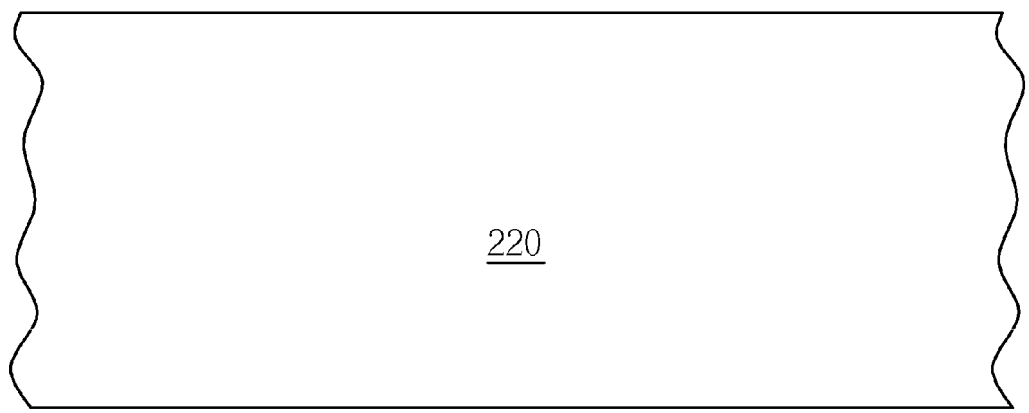
FIGS. 6-12 illustrate an embodiment of the method for defining an embedded structure of the present invention.

The present invention continues to provide a method for defining an embedded structure and further for forming the embedded structure. Please refer to FIGS. 6-12, illustrating an embodiment of the method for defining an embedded structure of the present invention. As shown in FIG. 6, first a dielectric layer 220 is provided. In one embodiment of the present invention, the dielectric layer 220 may further include a metallic complex, such as Mn, Cr, Pd or Pt. Once activated, such as by laser, the dielectric layer 220 helps another conductive layer to deposit with the help of the metallic complex.

Figure 7:
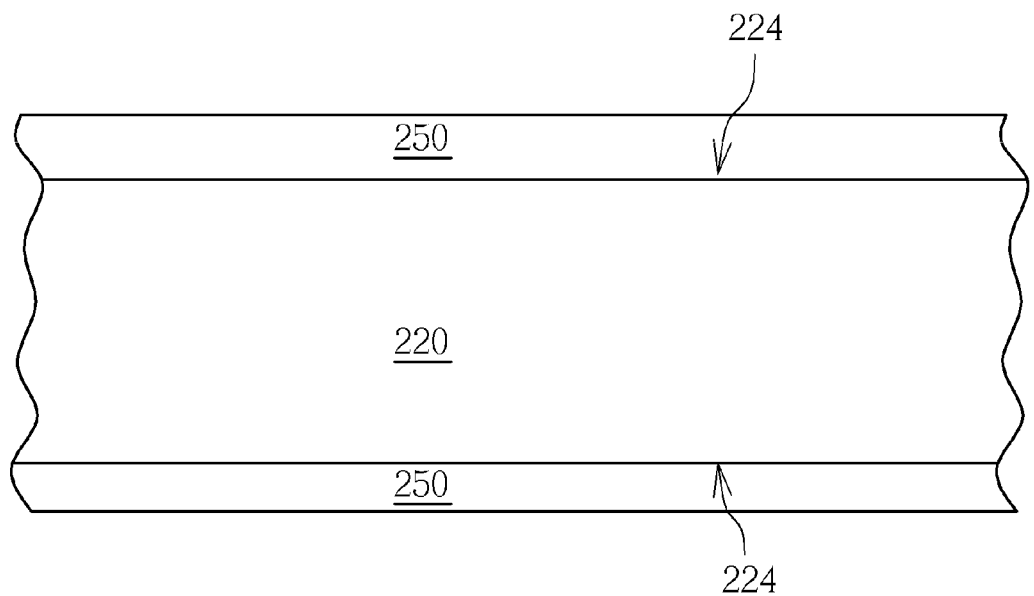

Second, as shown in FIG. 7, an organic film layer 250 is formed to cover the dielectric layer 220. Accordingly, the organic film layer 250 is capable of protecting the outer surface 224 of the dielectric layer 220 from any undesirable damages. The organic film layer 250 may optionally cover one outer surface 224 of the dielectric layer 220 or both sides of the outer surface 224 of the dielectric layer 220.

The organic film layer 250 may include a hydrophilic polymer to be optionally removed by water or a hydrophobic polymer. For instance, the hydrophilic polymer may include functional groups such as hydroxyl group (—OH), amide group (—CONH2), sulfonic group (—SO3H) and /or carboxylic group (—COOH).

Alternatively, the organic film layer 250 may include a hydrophobic polymer. For instance, the hydrophobic polymer may be methacrylate resin, vinyl phenyl resin, allyl resin, polyacrylate resin, polyether resin, polyolefin resin, polyamide resin, or polysiloxane resin.

The outer surface 224 of the dielectric layer 220 have an original roughness A, for example substantially even. The roughness may be expressed by either one of the parameters Ra. If expressed by Ra, the roughness A is <0.5 μm.

Figure 8:
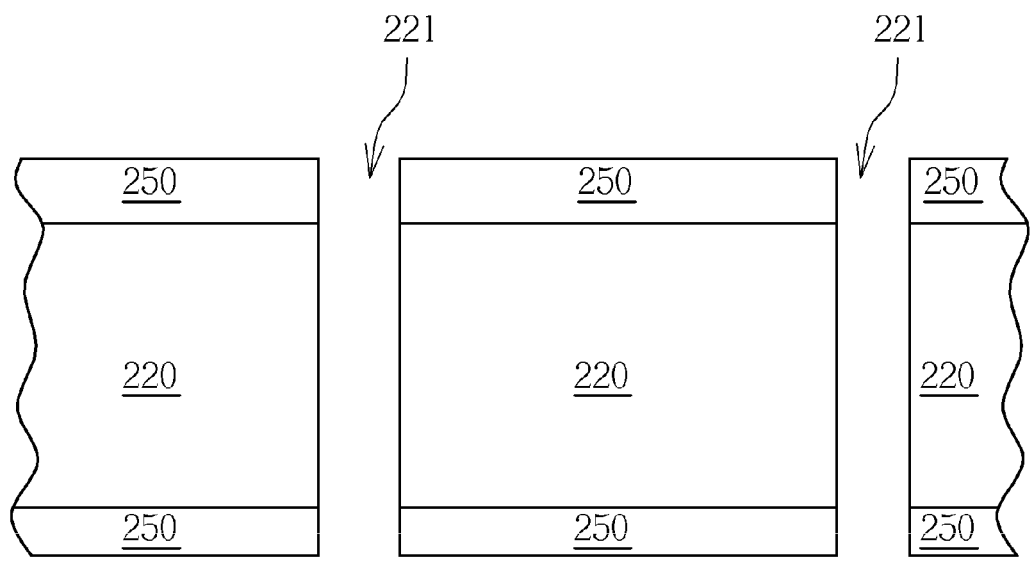

Then, as shown in FIG. 8, at least one via 221 is formed in the dielectric layer 220 and in the organic film layer 250. The via 221 penetrates the dielectric layer 220 and the organic film layer 250 to form a through hole. The via 221 may be formed by using laser to remove part of the dielectric layer 220 and part of the organic film layer 250. Each via 221 may have at least one pad opening 222. In other words, a via 221 may optionally have one pad opening 222 or two pad openings 222.

Figure 9:
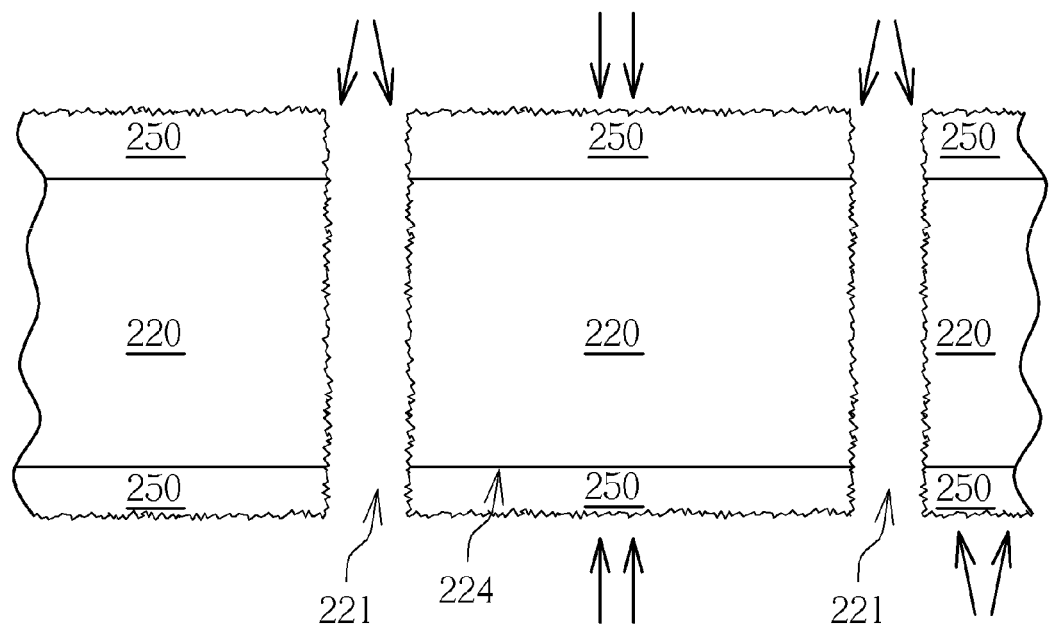

Afterwards, a cleaning step is performed to etch the inner surface of the dielectric layer 220 as well as the organic film layer 250, and leaves both the inner surface of the dielectric layer 220 and of the organic film layer 250 attacked, i.e. a rugged surface, as shown in FIG. 9. However, thanks to the protection of the organic film layer 250, the outer surface 224 of the dielectric layer 220 is kept from the attacks of the cleaning step and retains its original roughness A, for example a substantially even surface. The cleaning step may include the use of energy particles, such as plasma, or of an oxidizing agent, such as permanganate.

The organic film layer 250 is capable of protecting the outer surface 224 of the dielectric layer 220 from any undesirable attacks. The organic film layer 250 may include a hydrophilic polymer to be optionally removed by water. For instance, the hydrophilic polymer may include functional groups such as hydroxyl group (—OH), amide group (—CONH2), sulfonic group (—SO3H) and /or carboxylic group (—COOH).

Alternatively, the organic film layer 250 may include a hydrophobic polymer. For instance, the hydrophobic polymer may be methacrylate resin, vinyl phenyl resin, allyl resin, polyacrylate resin, polyether resin, polyolefin resin, polyamide resin, or polysiloxane resin.

Figure 10:
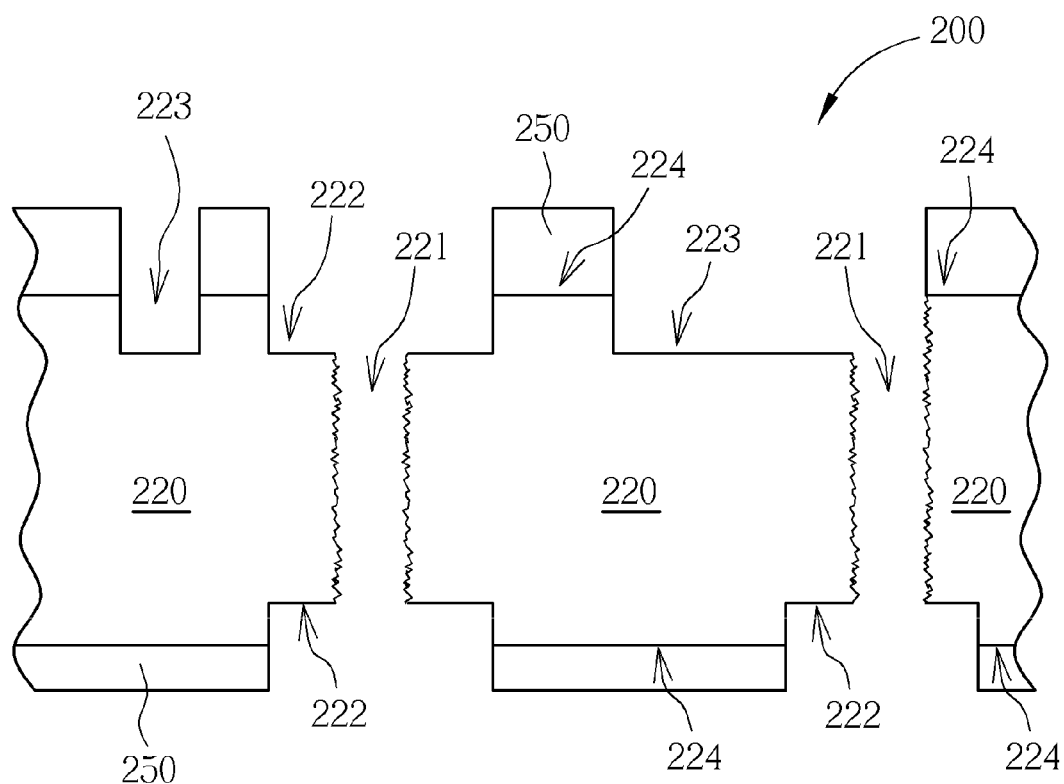

As shown in FIG. 10, afterwards, the dielectric layer 210 and the organic film layer 250 are patterned to form pad openings 222, optional trenches 223 and simultaneously to reinforce the vias 221. The pad opening 222 encircles, or in other words, overlaps with the via 221, and the via 221 and the pad opening 222 together define the embedded structure of the present invention.

By contrast with the pad opening 222, the trench 223 does not encircle the via 221 but may be connected to the via 221. Similarly, the pad opening 222, and the optional trench 223 may be formed by using laser to remove part of the dielectric layer 220 and part of the organic film layer 250. When the pad opening 222 and the optional trench 223 are formed, the inner wall of the trench 223 has a roughness B and the inner wall of the pad opening 222 has a roughness B. If expressed by Ra, the roughness B is between 0.2 μm and 1.5 μm.

The formation of the pad opening 222 and the optional trench 223 also reinforces the via 221, so the inner wall of the via 221 may have a different roughness, namely roughness C. Again, if expressed by Ra, the roughness C is between 0.5 μm and 5.0 μm. A, B and C are mutually different. For example, the roughness A, B and C have relative relations, C>B>A.

If the dielectric layer 220 includes the metallic complex, the formation of the pad opening 222 and the optional trench 223 also activates the metallic complex. Once activated, such as by laser, the dielectric layer 220 helps another conductive layer to deposit with the help of the metallic complex.

Figure 11:
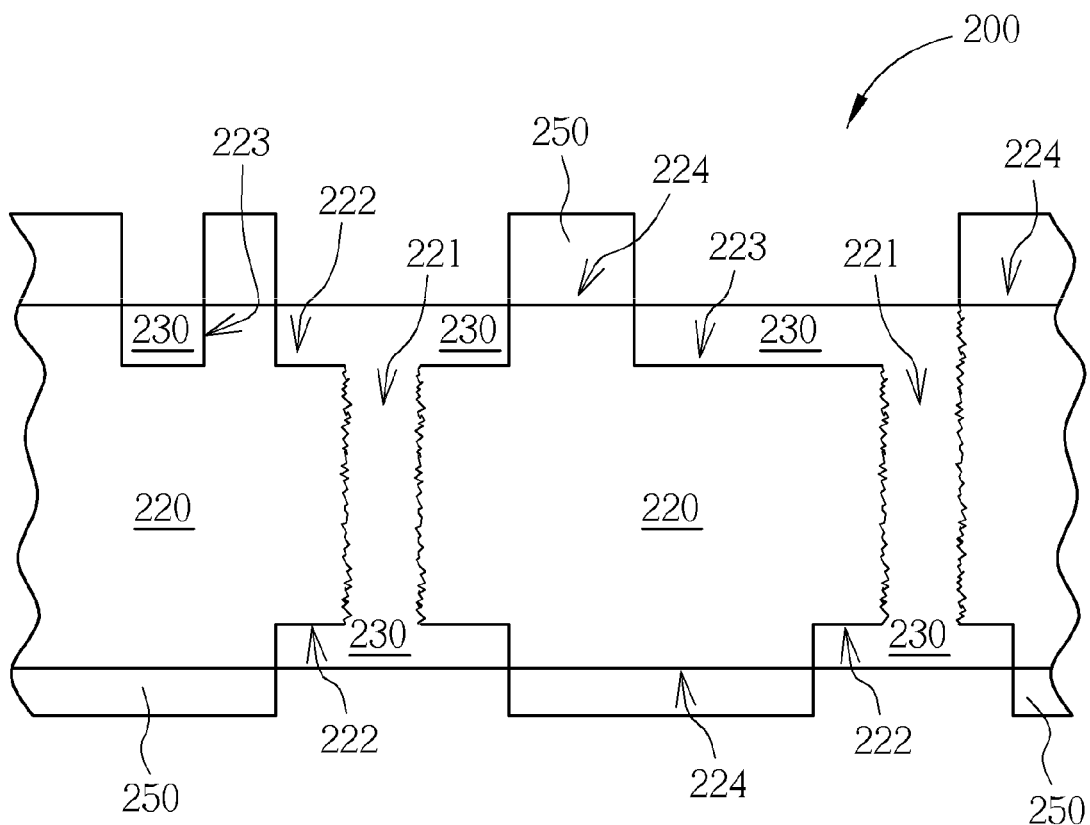

In order to form the embedded circuit structure of the present invention, as shown in FIG. 11, a first deposition step is performed to form a conductive layer 230 in the via 221, the pad opening 222 and the trench 223. Preferably, the first deposition step is an electroless plating procedure. If the dielectric layer 220 includes the metallic complex and is activated by the formation of the pad opening 222 and the optional trench 223, the dielectric layer acts as a seed layer for the electroless plating. The conductive layer 230 usually includes a metal, such as Cu or Al. If necessary, a second deposition step, such as electroplating, is optionally performed so that the conductive layer 230 fills the via 221, the pad opening 222 and the trench 223. Because the inner wall of the via, the pad opening and the trench are formed or reinforced after the cleaning step, less copper lumps will be formed and a conductive layer of better quality can be obtained due to a smoother surface.

Figure 12:
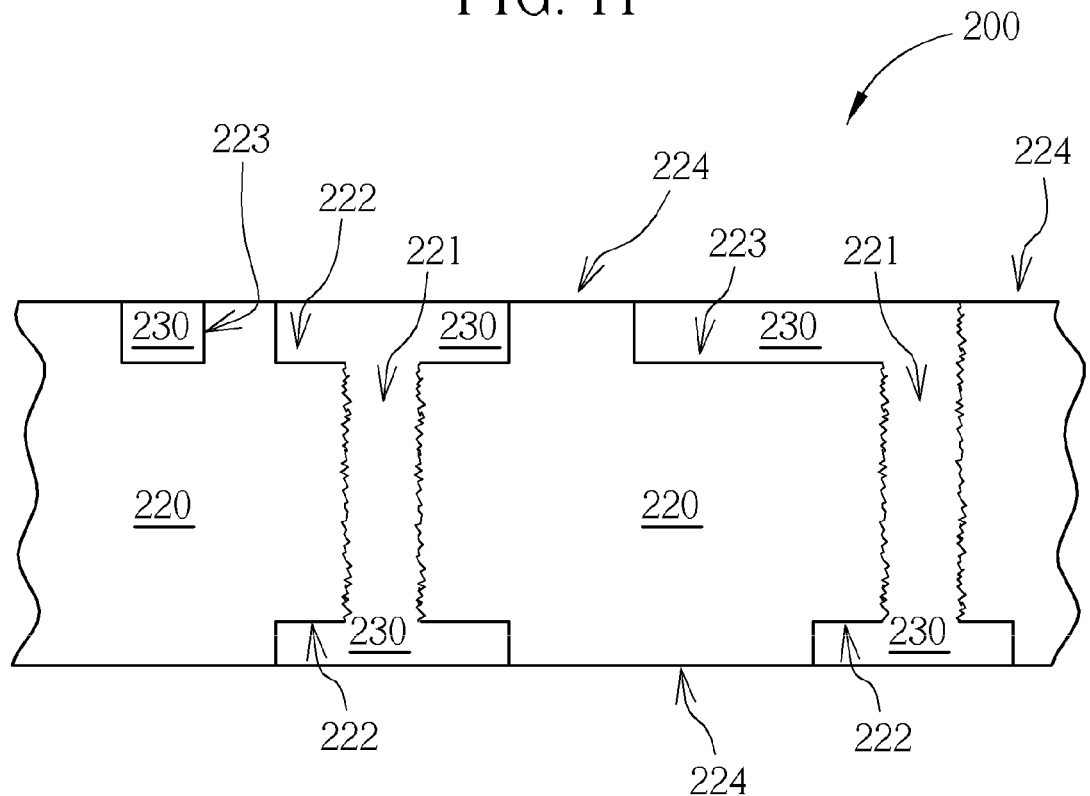

Optionally, the organic film layer 250 may remain on the dielectric layer 220 or not. If not, the organic film layer 250 is removed, so as to leave the dielectric layer 220 a substantially even surface, as shown in FIG. 12. When the organic film layer 250 includes a hydrophilic polymer, the organic film layer 250 may be washed off by water.

Because the embedded structure of the present invention has gone through a patterning step after the cleaning step, the inner wall of the via, the pad opening and the trench of the present invention may have a smoother surface. Moreover, less copper lumps will be formed and a conductive layer of better quality can be obtained when a layer of copper is later deposited on the inner wall of the embedded structure of the present invention due to the smoother surface. The smoother surface is able to raise the reliability of the embedded structure of the present invention. In addition, the embedded structure of the present invention may further have a substantially even outer surface because of the protection of the organic film layer during the manufacturing process.

Those skilled in the art will readily observe that numerous modifications and alterations of the device and method may be made while retaining the teachings of the invention.

What is claimed is:

1. A method for defining an embedded structure, comprising:
   providing a dielectric layer;
   forming an organic film layer to cover said dielectric layer;
   forming a via in said dielectric layer and in said organic film layer;
   performing a cleaning step to roughen an inner wall of said via such that the inner wall of said via has a roughness C;
   patterning said dielectric layer and said organic film layer to form a pad opening overlapping with said via in said dielectric layer and having a roughness B; and
   removing said organic film layer to expose an outer surface of said dielectric layer having a roughness A, wherein said via and said pad opening together define said embedded structure and A, B, C are mutually different.

2. The method of claim 1, further comprising:
   forming a trench in said dielectric layer, wherein the inner wall of said trench has said roughness B.

3. The method of claim 1, wherein C>B>A.

4. The method of claim 1, further comprising:
   performing a first deposition step to form a conductive layer filling said via and said pad opening.

5. The method of claim 4, wherein said first deposition step is an electroless plating.

6. The method of claim 5, wherein said dielectric layer acts as a seed layer for said electroless plating.

7. The method of claim 4, further comprising:
   performing a second deposition step so that said conductive layer fills said via and said pad opening.

8. The method of claim 1, wherein said dielectric layer comprises a metallic complex.

9. The method of claim 8, wherein said metallic complex comprises a metal selected from a group consisting of Mn, Cr, Pd and Pt.

10. The method of claim 1, wherein said organic film layer comprises a hydrophilic polymer, wherein said hydrophilic polymer comprises a functional group selected form a group consisting of hydroxyl group (—OH), amide group (—CONH2), sulfonic group (—SO3H) and carboxylic group (—COOH).

11. The method of claim 1, wherein said organic film layer comprises a hydrophobic polymer, wherein said hydrophobic polymer is selected form a group consisting of methacrylate resin, vinyl phenyl resin, allyl resin, polyacrylate resin, polyether resin, polyolefin resin, polyamide resin, and polysiloxane resin.

12. The method of claim 1, wherein said cleaning step is selected from a group consisting of plasma and an oxidizing agent.

13. The method of claim 1, wherein said patterning said dielectric layer is carried out by laser.

14. The method of claim 1, wherein patterning said dielectric layer activates the surface of said dielectric layer.

15. The method of claim 1, wherein said roughness C is expressed by 0.5 μm<Ra<5.0 μm.

16. The method of claim 1, wherein said roughness B is expressed by 0.2 μm<Ra<0.5 μm.

17. The method of claim 1, further comprising:
removing said organic film layer so as to leave said dielectric layer a substantially even surface.

18. The method of claim 1, wherein said roughness A is expressed by Ra<0.5μm.

* * * * *